United States Patent [19]

MacIver et al.

[11] Patent Number: 4,786,952
[45] Date of Patent: Nov. 22, 1988

[54] HIGH VOLTAGE DEPLETION MODE MOS POWER FIELD EFFECT TRANSISTOR

[75] Inventors: Bernard A. MacIver, Lathrup Village; Kailash C. Jain, Sterling Heights, both of Mich.

[73] Assignee: General Motors Corporation, Detroit, Mich.

[21] Appl. No.: 888,697

[22] Filed: Jul. 24, 1986

[51] Int. Cl.⁴ ..................... H01L 29/78; H01L 27/10
[52] U.S. Cl. ................................. 357/23.4; 357/23.8; 357/45
[58] Field of Search ..................... 357/23.8, 23.4, 23.1, 357/45

[56] References Cited

U.S. PATENT DOCUMENTS

| 3,508,123 | 4/1970 | Liles | 317/234 |
|---|---|---|---|
| 3,624,895 | 12/1971 | MacIver et al. | 29/570 |
| 3,648,340 | 3/1972 | MacIver | 29/25.42 |
| 3,678,347 | 7/1972 | Tulp et al. | 317/235 R |
| 3,877,053 | 4/1975 | Kaplit | 357/23 |
| 4,141,021 | 2/1979 | Decker | 357/22 |
| 4,376,286 | 3/1983 | Lidow et al. | 357/23.4 |
| 4,463,366 | 7/1984 | Ishii et al. | 357/22 |
| 4,611,220 | 9/1986 | MacIver | 357/23.4 |

FOREIGN PATENT DOCUMENTS

| 42522 | 12/1981 | European Pat. Off. | 357/23 TF |
|---|---|---|---|
| 2045177 | 3/1972 | Fed. Rep. of Germany | 357/23 R |
| 47-3213 | 1/1972 | Japan | 357/23 R |
| 186371 | 10/1984 | Japan | 357/23.4 |

OTHER PUBLICATIONS

B. A. MacIver and K. C. Jain, IEEE Electron Device Letters, EDL-5, No. 5, May 1984, p. 154.
S. M. Sze, Physics of Semiconductor Devices, pp. 314-322, 2nd Edition, John Wiley & Sons, Inc., New York, N.Y., 1981.
M. Akiya, K. Ohwada and S. Nakashima, "High-Voltage Buried-Channel MOS Fabricated by Oxygen Implantation into Silicon," Electronics Letters, vol. 17, No. 18, pp. 640-641 (Sep. 3, 1981).
S. R. Hofstein, "An Analysis of Deep Depletion Thin-Film MOS Transistors," IEEE Transactions on Electron Devices, vol. ED-13, No. 12, pp. 846-855, (Dec. 1986).
Editorial, "IC Techniques Boost Power-FET Current," Electronic Times, p. 1, (Dec. 21, 1981).

Primary Examiner—Martin H. Edlow
Assistant Examiner—David R. Josephs
Attorney, Agent, or Firm—Robert J. Wallace

[57] ABSTRACT

A vertical depletion mode power field effect transistor having a greatly increased drain-to-source breakdown voltage. The drain region is formed in the substrate and separated from the channel by a first insulative layer having apertures which allow the passage of electrical currents. The channel, which is formed between the first insulative layer and a second insulative layer parallel to the substrate surface, contains both a source region, formed by implantation of impurities of the same type as are used to form the drain region, and a gate region. In this configuration, the normally high voltage which exists between the gate and drain is imposed over a greater distance than in conventional depletion mode vertical FETs, so that this new configuration produces vertical power FETs having much higher breakdown voltages than do conventional depletion mode vertical FETs. Islands having a conductivity type opposite to that used to form the source region are formed immediately below the second insulative layer and serve to prevent the creation of a charge inversion layer in the channel, where the inversion layer adversely affects the turn off characteristic of the j-MOS power transistor.

9 Claims, 3 Drawing Sheets

HIGH VOLTAGE DEPLETION MODE MOS POWER FIELD EFFECT TRANSISTOR

FIELD OF THE INVENTION

This invention relates to vertical field effect transistors. More particularly, it relates to vertical power field effect transistors having increased drain-to-source breakdown voltages.

BACKGROUND OF THE INVENTION

Vertical depletion mode field effect transistors (FETs) offer a more compact use of a substrate because their drain, gate, and source regions are disposed vertically above one another. Because the channels defined by such vertical FETs are necessarily much shorter than those which can be achieved in a laterally constructed FET, vertical FETs break down at relatively low drain-to-source voltages. These relatively low breakdown voltages mean that vertical FETs are not acceptable as power transistors over a full range of drain-to-source voltages.

Thus, it is desirable to create a vertical insulated gate FET (IGFET) structure which is capable of sustaining higher drain-to-source voltages than presentday vertical IGFETs.

SUMMARY OF THE INVENTION

The present invention relates to a novel vertical depletion mode IGFET structure that substantially increases the breakdown drain-to-source voltage without adversely affecting the density with which such transistors can be placed on a substrate. Because of their improved breakdown voltage characteristics, such FETs are especially suitable to serve as power transistors.

In general, the FET structure providing this improved performance has a drain region in the substrate, separated from the transistor gate by a relatively long drift region. The gate is defined above a channel between the substrate surface and an insulative surface spaced apart from the substrate surface. The increased distance between the drain region and the gate substantially decreases the electric fields in the channel by imposing virtually the entire drain-to-source voltage across the long drift region. Because the electric fields in the channel and drift regions are proportional to the drain-to-source voltage imposed, these voltages can reach much higher levels before they create electric fields which cause breakdown to occur.

In the preferred embodiment, the vertical FET device having a high drain-to-source breakdown voltage comprises a substrate of a semiconductor material of a first conductivity type, a drain region in the substrate, and a first electrically insulating layer formed on the substrate surface with a pattern of apertures. The first insulating surface is covered by an epitaxial layer made from the same material as the substrate. The epitaxial layer extends to make contact with portions of the substrate surface through the apertures in the first insulative layer. Electrical currents can pass through the apertures from the substrate to the epitaxial layer.

The epitaxial layer is, in turn, covered by a second insulative layer having two sets of apertures. In the channel, source regions are formed by implantation of dopants of the first conductivity type through one or more apertures in the second insulative layer. One or more gate electrodes are formed over those portions of the second insulative layer that overlay the gate region.

An insulative layer of phosphosilicate glass lies over the gate electrodes and a metallic layer forms ohmic contacts with portions of the upper surface of the epitaxial layer through the second subset of aperatures in the second insulative layer.

DESCRIPTION OF THE PREFERRED EMBODIMENT

Figure 1:
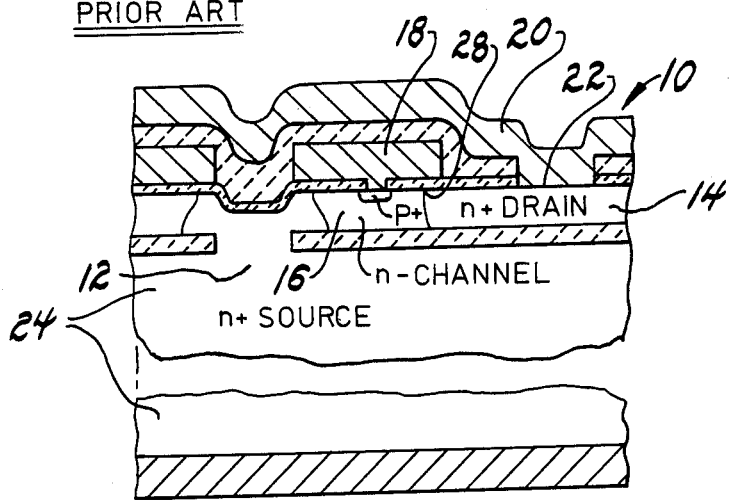
FIG. 1 shows a cross-sectional view of a thin film depletion mode vertical IGFET known in the prior art.

FIG. 1 of the drawing shows a prior art junction metal oxide semiconductor (j-MOS) transistor 10 having a source region 12, a drain region 14, and a channel region 16 controlled by a gate 18. Those skilled in the art will understand that the j-MOS transistor of FIG. 1 is a "vertical" transistor because electrical contact to drain region 14 is made between metal layer 20 and surface 22 of drain region 4. Electrical contact with source region 12 is accomplished by connection to the body of substrate 24 (the contact not shown). The details of the structure of the vertical j-MOS transistor 10 of FIG. 1 are disclosed in copending patent application, Ser. No. 552,409, "A Junction-MOS Power Field Transistor," filed Nov. 16, 1983, by B. A. MacIver, which is hereby incorporated by reference.

Typically, the vertical MOS transistor 10 of FIG. 1 is operated under conditions where most of the voltage potential $V_{DS}$ between the drain region 14 ano the source region 12 is imposed between drain region 14 and gate 18. Because the voltage on gate 18 controls the electric fields in channel 16, a very strong electric field exists at interface 28 between drain region 14 and channel region 16. As the voltage between drain 14 and gate 18 is increased, the electric fields at interface 28 also increase until they reach a level where breakdown occurs. The occurrence of a breakdown therefore places a limit on the voltage which may be applied between drain region 14 and source region 12, severely restricting the drain-to-source voltage range over which vertical MOS transistor 10 of FIG. 1 can be used as a power transistor.

Experiments with the vertical MOS transistor structure of FIG. 1 have produced transistors having a maximum breakdown voltage from drain to source ($BV_{DS}$) of 21 volts. We expect the maximum $BV_{DS}$ achievable in the configuration of FIG. 1 to be less than 40 volts.

Figure 2:
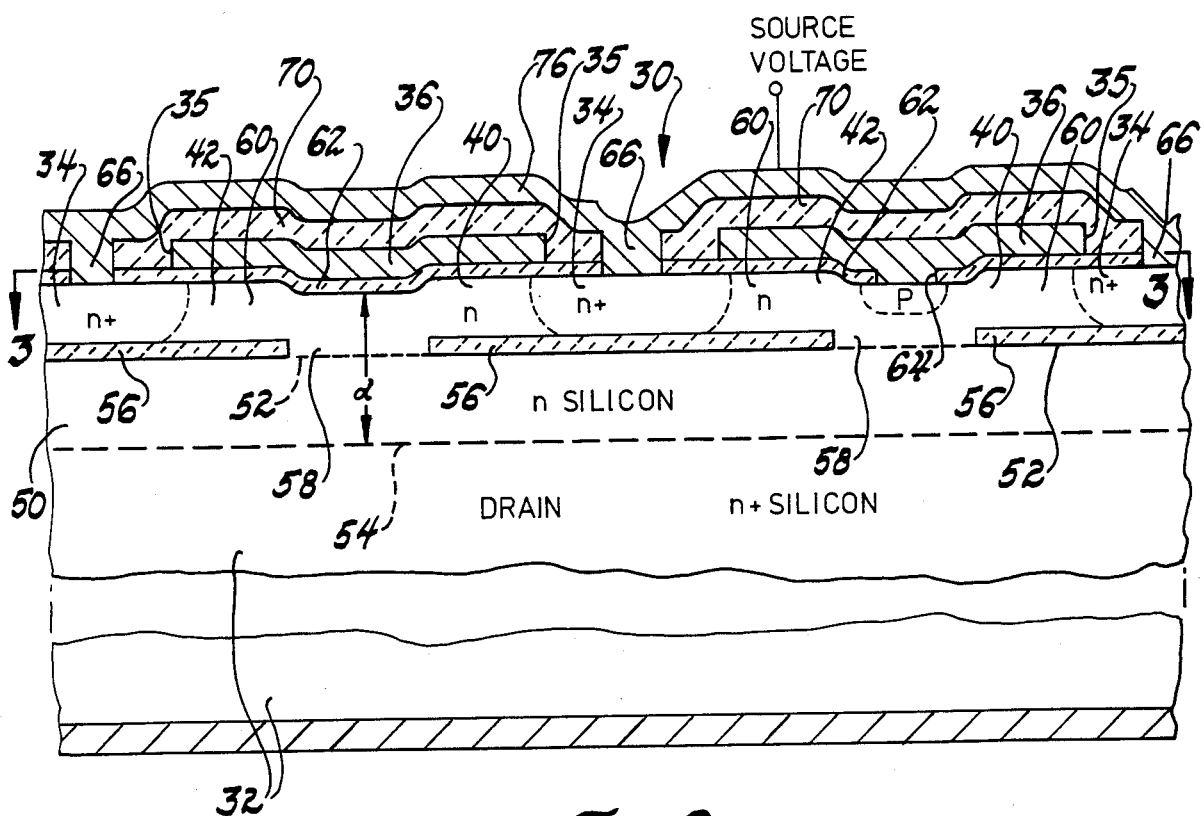
FIG. 2 shows an enlarged fragmentary crosssectional view, along the line 2—2 of FIG. 6, of a thin film depletion mode vertical IFGET made in accordance with this invention.

The vertical MOS transistor shown in cross section in FIG. 2 has a structure which differs from that of the transistor of FIG. 1. This new structure creates a vertical MOS transistor which can serve as a power transistor, capable of withstanding much larger drain-to-source voltages without breakdown. A major distinction between the vertical MOS transistors of FIGS. 1 and 2 is that the transistor of FIG. 2 has its drain region located in the substrate while the source electrode is attached to the surface of the transistor. This change allows a given $V_{DS}$ to be imposed over a greater distance in the substrate, thereby reducing the magnitudes of the electric fields in the substrate.

Referring now to FIG. 2 of the drawings, the vertical MOS transistor structure 30 will be described. The structure at 30 comprises drain region 32, n+ doped source regions 34, and gate regions 36. Gates 36 simultaneously control channel regions 40 and 42 in a parallel fashion to be explained subsequently. Through their effect on the electric fields in channels 40 and 42, gates 36 respectively control the movement of carriers between sources 34 and drain 32 through their respective channels. Because most of the voltage drop between drain 32 and sources 34 is imposed across the region between drain 32 and those portions of channels 40 and 42 that closely underlie gates 36, the source-to-drain breakdown voltage, $BV_{DS}$, is imposed across a distance controlled by the transistor designer.

To produce a j-MOS power field effect transistor, it is necessary that channel regions 40 and 42 be made sufficiently thick to handle the required high current levels. Such a power transistor is difficult to completely turn off because of the inability of the depletion region, formed when applying a turn-off voltage to the transistor gate, to penetrate across the full thickness of the channel region. The distance by which the depletion region extends across the channel region is affected by an inversion layer formed at the interface between the gate insulator and the semiconductor material. Therefore, it is desirable to reduce this inversion layer. Island 64, formed in a possibly remotely located portion of the substrate, acts to preclude accumulation of minority current carriers at the channel surface, thereby reducing the accumulation of minority current carriers at the channel surface and precluding the formation of an inversion layer. Region 64 can be formed remotely of the other portions of transistor 30.

The vertical MOS transistor structure shown in FIG. 2 can be constructed from an n-type silicon substrate having a surface line 52. Drain region 32 is defined in the lower part of the n-type substrate by implanting appropriate impurities (such as impurities contributing holes as current carriers) into the upper surface region 50 of the n-type substrate. We thus choose to consider that the upper surface of drain region 32 is substantially uniformly spaced from surface 52 by upper surface region 50, along line 54. This drain region spacing may typically be at least 3 micrometers. We have determined that the breakdown voltage increases by approximately 25 to 30 volts per micrometer of drain region depth from surface 52.

Figure 3:
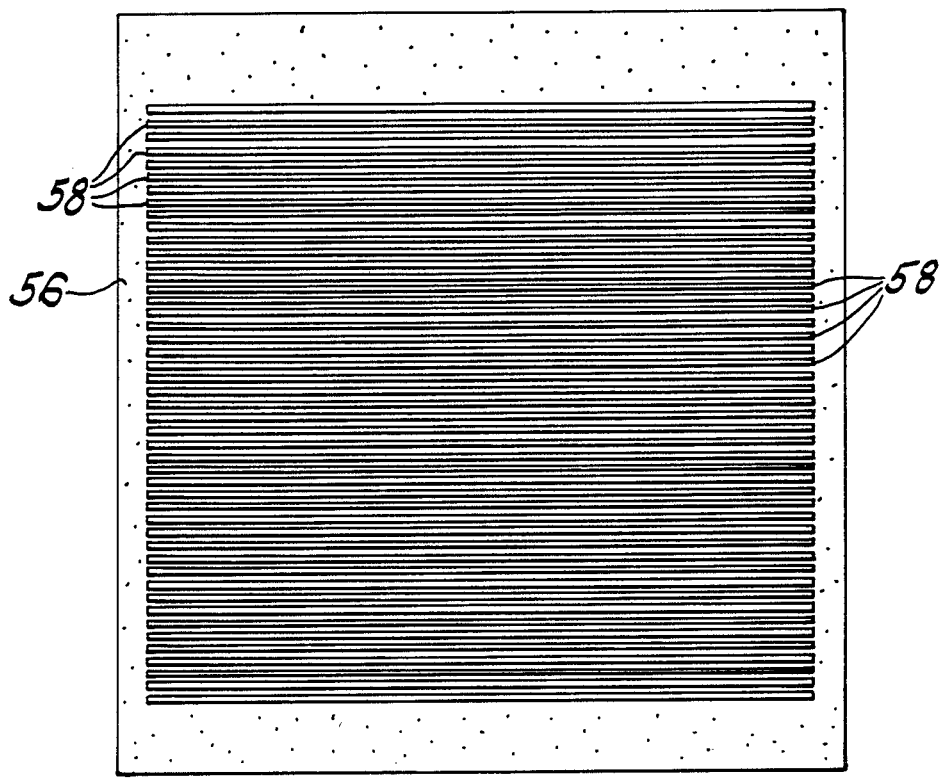
FIG. 3 shows a schematic plan view of the thin film depletion mode vertical IGFET of FIG. 2 along the line 3—3 of FIG. 2.
Figure 4:
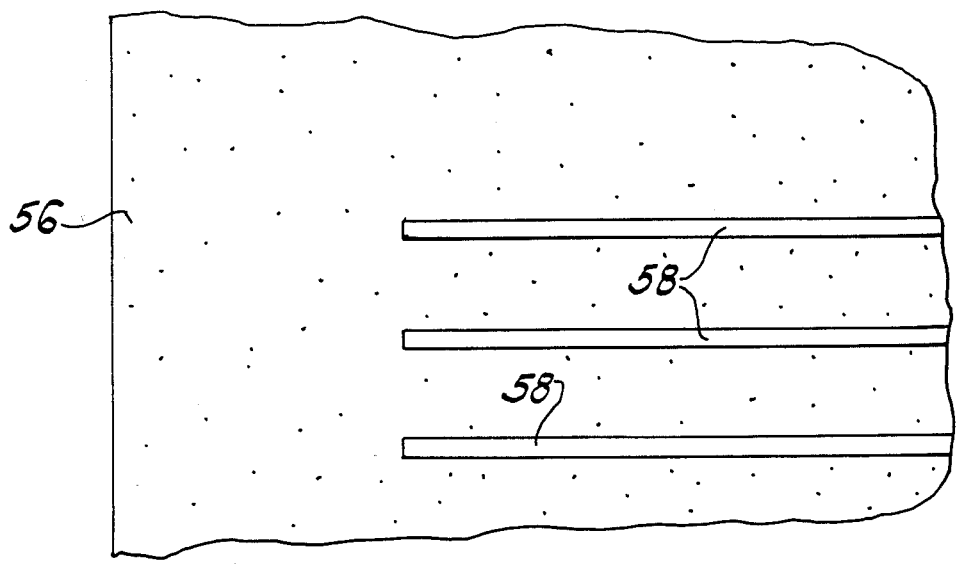
FIGS. 4–6 show plan views of intermediate steps in the formation of the thin film depletion mode vertical IGFET shown in cross section in FIG. 2.

A pattern of an electrically insulating material 56 such as silicon dioxide ($SiO_2$) is formed on surface line 52 of substrate 50, the pattern providing for apertures 58 which will permit the passage of charge carriers between the source and drain. Portions of surface 52 are exposed through apertures 58 at this point. FIG. 3 shows the appearance of a typical insulating layer 56, showing the apertures 58. As can be seen, layer 56 covers the entire surface 52 except for those portions exposed in apertures 58. FIG. 4 shows an enlarged fragmentary view of a portion of the insulating layer 56. A silicon layer 60 is disposed on layer 56 (see FIG. 2). It contacts the n-type substrate through apertures 58. Silicon layer 60 could be formed by deposition techniques, preferably epitaxial deposition techniques.

Alternatively, the patterned insulating layer can be created by implanting oxygen (O+) immediately below a surface layer 60 of the n-type substrate, using masks to create the desired pattern, and then annealing the implanted substrate to create subsurface silicon dioxide ($SiO_2$) layer 56. The resulting subsurface silicon dioxide layer can be approximately 4000 angstroms thick. Alternatively, the patterned insulative layer 56 can be formed on the surface 52 of the substrate by thermal oxidation and layer 60 subsequently deposited.

Regardless of how the first insulative layer 56 is formed, the layer overlying layer 56 is preferably an epitaxial layer 60 of a semiconductor material of the same type as in the n-type substrate. Epitaxial layer 60 is a blanket layer covering the entirety of layer 56, and makes contact with the surface 52 through the apertures 58. The epitaxial layer 60 may have a slightly dimpled surface where it overlies apertures 58. Epitaxial layer 60 is between 1.5 and 2.0 micrometers thick.

A second electrically insulating layer, gate insulating layer 62, is next formed over the entire surface of the epitaxial layer 60. This layer is etched away in selected locations that can be, but are not necessarily, above an aperture 58, to form a relatively few apertures 64. The total area of apertures 64 can be a very small fraction of the total gate area of the j-MOS power transistor, say, above five percent, or less. A suitable fraction could be 0.01 percent, or less. Before removing the mask used to create apertures 64, a dose of $1 \times 10^{15}$ atoms of $^{49}BF_2{}^+$ per square centimeter is applied at 100 keV. This creates the p+ islands in apertures 64.

Next, gate insulating layer 62 is selectively etched away in a pattern of long, closely spaced, parallel rectangles 66 to allow electrical contact between a source electrode and the upper surface of epitaxial layer 60.

Figure 5:
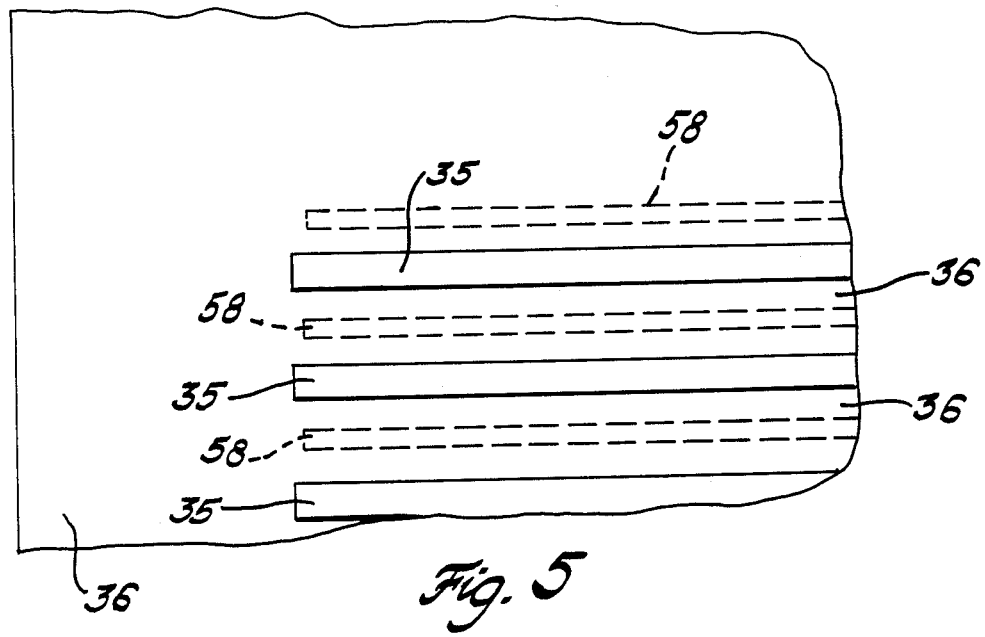

Gate portions 36 are next formed above channel regions 40 and 42. These gate portions 36 are integral parts of a blanket constructed from a polycrystalline silicon layer 38 (see FIG. 5). Portions 36 are analogous to rungs of a ladder and can be wider than apertures 58 which they overlie. This allows the gate electrodes (i.e., all of the gate portions 36) to control the electric fields in adjacent portions of epitaxial layer 60. The gate electrode portions 36 are defined by opening a pattern of parallel apertures 35 in a blanket polycrystalline silicon coating 38 between insulative layer apertures 58. Apertures 35 have substantially the same length as apertures 58 (see FIG. 5, where apertures 58 are outlined in dashed lines).

Layer 38 also overlies and makes electrical contact with the p+ islands in apertures 64, shown as a square outlined in alternating dots and dashes. The square apertures can be spaced outwardly from the square shape of the transistor whose subsurface insulative layer is shown in FIG. 3, and, in greater detail, in FIG. 4, or can be formed under the gate regions 36 of layer 38. Four square apertures 64, displaced diagonally from the square source-gate-drain region of the transistor will adequately prevent the build-up of an inversion layer and ensure good performance of power transistor.

As is disclosed in copending U.S. patent application no. 552,409, a second pn junction can be formed in each aperture 64 by redoping a portion of the area that has already been doped p+-type. This redoping can form a small, nested, pocket of n-type material in the layer of p+-type. The advantage of this configuration is that the j-MOS power transistor will not form an inversion layer under gate insulation layer 62, even when the transistor is reverse-biased.

Figure 6:
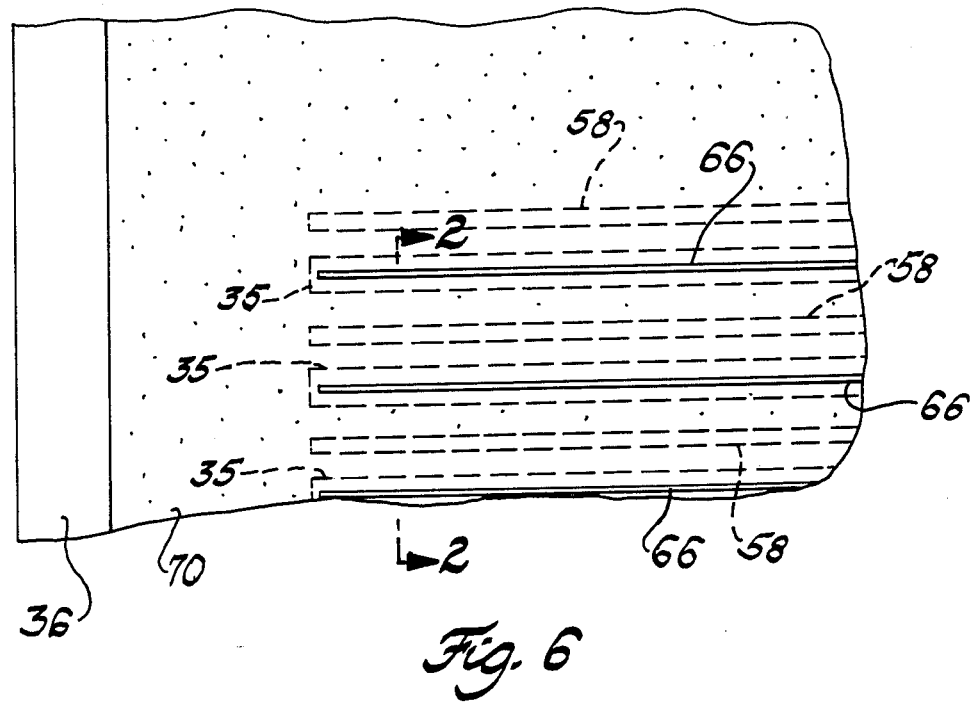

Much of polycrystalline silicon layer 38 is next overlaid by a blanket layer of phosphosilicate glass 70 which serves as an insulator to electrically isolate the gate from an overlying source electrode 76 (see FIG. 6).

At this stage, source regions 34 are created by implanting an appropriate electron-contributing dopant, such as $^{31}$p+, into epitaxial layer 60 through apertures 35. The dose is $2 \times 10^{16}$ atoms per square centimeter at 140 keV. Source region 34 extends from the undersurface of insulating layer 62 to the upper surface of insulating layer 56, as shown in FIG. 2.

By a masked etching step, apertures 66 are formed through the phosphosilicate glass layer 70 and the gate insulating layer 62 to provide a cut to supply source region voltage to the exposed surface portion of epitaxial layer 60. This structure can be seen in FIG. 6, which shows that phosphosilicate glass layer 70 does not extend to the full width of gate layer 38. The apertures 35 are shown outlined in dotted lines.

Finally, metal layer 76 is formed over virtually the entire surface of phosphosilicate glass layer 70 so that a metal contact is made between the source voltage and the surface of the epitaxial layer that has been exposed through aperture 66. The resultant product is shown in cross section in FIG. 2.

Modifications of the preferred embodiment described above which do not depart from the spirit and scope of the invention will be apparent to those skilled in the art.

The embodiments of the invention in which an exclusive property or privilege is claimed are defined as follows:

1. A vertical FET device having a high drain-to-source breakdown voltage, comprising:
    a substrate of a semiconductor material of a first each of the source electrode apertures being doped with an impurity of the first conductivity type to form a more highly doped source region therein, and a second disjoint subset of said set of apertures not overlying said source regions, the portion of the third drain layer adjacent each aperture in said second subset of apertures being doped with an impurity of a conductivity type opposite to the first conductivity type;
    one or more gate electrodes over the portion of the gate insulating layer adjacent said one or more source apertures;
    an insulating layer over each of the gate electrodes, each said insulating layer being placed so as to leave one or more source regions in the third drain layer exposed through the source apertures; and
    a source electrode layer for making electrical contact with each of the plurality of source regions in the epitaxial layer.

2. The vertical FET device of claim 1, wherein the surface of the second drain layer is substantially uniformly spaced from the substrate surface.

3. The vertical FET device of claim 2, wherein the apertures in said gate insulating layer are disposed substantially parallel to the first electrically insulating layer.

4. The vertical FET device of claim 1, wherein said source electrode layer is formed over said insulating layer over each gate electrode.

5. The vertical FET device of claim 1, wherein the apertures in the first insulating layer are elongated rectangles, said rectangles being substantially parallel along their longer side.

6. The vertical FET device of claim 5, wherein said second drain layer has a thickness of at least 3 micrometers.

7. The vertical FET device of claim 6, wherein the thickness of the third drain layer is in the range of 1.5 to 2 micrometers.

8. The vertical FET device of claim 1, wherein the first conductivity type is n-type and the second conductivity type is p-type.

9. A vertical FET device having a high drain-to-source breakdown voltage, comprising:
    a substrate of a semiconductor material of n conductivity type, said substrate having an n− surface and an n+ surface;
    an n− drain region layer over the n− substrate surface, said n− drain region layer having a surface opposite from the substrate surface, said opposite drain region surface being substanitally uniformly spaced from the substrate surface by a distance of at least 3 micrometers;
    a first electrically insulating layer of $SiO_2$, on the substrate surface spacing the drain region layer and the substrate surface apart in some but not all portions of its length and width, said insulating layer having one or more apertures therethrough in other portions, each of said apertures being an elongated rectangle, said rectangles being substantially parallel along their longer side; said drain region layer contacting the substrate surface through said one or more rectangular apertures;
    a gate insulating layer of $SiO_2$ over said surface of the drain region layer, said gate insulating layer having a set of apertures disposed substantially parallel to the first electrically insulating layer, a first subset of said apertures in said set of apertures being source region electrode apertures, said source region electrode apertures directly overlaying the drain region layer, the portion of the drain region layer adjacent each of the source region electrode apertures being doped with an n-type impurity to form a source region therein, said gate insulating layer further having a second disjoint subset of apertures, the portion of the drain region layer adjacent each aperture in said second subset of apertures being doped partially through its thickness to a p-type conductivity;
    one or more gate electrodes over the portion of the gate insulating layer adjacent the second sheet of apertures;
    an insulating layer of phosphosilicate glass over the gate electrodes, with said insulating layer having one or more apertures therein overlying the source region apertures in the gate insulating layer, effective to expose the surface of the source regions exposed through the source apertures in the gate insulating layer; and
    a source electrode layer formed over said plurality of insulating layers for making electrical contact with each of the plurality of source regions exposed in the apertures in the insulating layer of phosphosilicate glass layer.

* * * * *